US006559059B2

United States Patent
Chien et al.

(10) Patent No.: US 6,559,059 B2
(45) Date of Patent: May 6, 2003

(54) METHOD FOR FABRICATING A MOS TRANSISTOR OF AN EMBEDDED MEMORY

(75) Inventors: Sun-Chieh Chien, Hsin-Chu (TW); Chien-Li Kuo, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 86 days.

(21) Appl. No.: 09/764,327

(22) Filed: Jan. 19, 2001

(65) Prior Publication Data

US 2002/0098703 A1 Jul. 25, 2002

(51) Int. Cl.$^7$ ............................................ H01L 21/00
(52) U.S. Cl. .................. 438/719; 438/724; 438/742; 438/754; 438/756
(58) Field of Search ........................ 438/199, 202, 438/715, 719, 720–721, 723, 724–737, 738, 740, 742–743, 744, 753, 754–755, 756–757; 216/2, 67, 79, 99

(56) References Cited

U.S. PATENT DOCUMENTS 6,074,960 A * 6/2000 Lee et al. ............... 438/754 X
6,107,211 A * 8/2000 Tseng .................... 438/719 X
6,194,320 B1 * 2/2001 Oi ........................ 438/756 X

* cited by examiner

Primary Examiner—William A. Powell
(74) Attorney, Agent, or Firm—Winston Hsu

(57) ABSTRACT

The present invention provides a method of manufacturing a MOS transistor of an embedded memory. The method of the present invention involves first defining a memory array area and a periphery circuit region on the surface of the semiconductor wafer and to deposit a gate oxide layer, an undoped polysilicon layer and a dielectric layer, respectively. Next, the undoped polysilicon layer in the memory array area is implanted to form a doped polysilicon layer followed by the removal of the dielectric layer in the memory array area. Thereafter, a metallic silicide layer and a passivation layer are formed, respectively, on the surface of the semiconductor wafer. The passivation layer, the metallic silicide layer and the doped polysilicon layer are then etched to form a plurality of gates in the memory array area. Next, the passivation layer, the metallic silicide layer and the dielectric layer in the periphery circuit region are removed. Finally, the undoped polysilicon layer is etched to form a plurality of gates in the periphery circuit region, followed by the formation of spacers, sources and drains of each MOS transistors, respectively, in the periphery circuit region.

18 Claims, 9 Drawing Sheets

METHOD FOR FABRICATING A MOS TRANSISTOR OF AN EMBEDDED MEMORY

BACKGROUND OF THE INVENTION

1. Field of the Invention

The present invention relates to a method of manufacturing a MOS transistor of an embedded memory, and more particularly, to a manufacturing method of a MOS transistor of an embedded memory to simultaneously form a periphery circuit region and a memory array area.

2. Description of the Prior Art

With increasing integration, the present trend of manufacturing semiconductor integrated circuits is to integrate memory cell arrays and high-speed logic circuit elements onto a single chip. An embedded memory composed of memory arrays and logic circuits significantly reduces the circuit area and increases the signal processing speed. The high-speed logic circuit element is also called a periphery circuit region.

Because the MOS transistors formed in the periphery circuit region requires low resistance and high speed, the present semiconductor process primarily uses a self-alignment silicide (salicide) process to form a silicide layer on each gate, source and drain of the MOS transistors formed on the periphery circuit region for reducing the surface resistance of each gate, source and drain of the MOS transistors. However, the self-aligned-contact (SAC) process developed for solving the electrical connection problem of memory cells in the memory array area involves forming a silicon nitride layer, as a cap layer, and a spacer on the top and side surfaces of a gate of a pass transistor formed in the memory array area as an isolation mask in the subsequent SAC process. Therefore, in the prior art method, the two processes conflict and are not performed simultaneously, resulting in increased time and cost.

Please refer to FIG. 1 to FIG. 9 FIG. 1 to FIG. 9 are cross-sectional diagrams of a prior art method for manufacturing a metal-oxide-semiconductor (MOS) transistor of an embedded memory on a semiconductor wafer 10. As shown in FIG. 1, the surface of the silicon substrate 16 is divided into a memory array area 12 and a periphery circuit region 14, and each region is separated by several shallow trench isolation structures 11. The prior art method involves forming a dielectric layer 18, a polysilicon layer 20 and an etching barrier layer 22, respectively, on the surface of the semiconductor wafer 10. Then, as shown in FIG. 2, a mask layer 24 is formed over the etching barrier layer 22 in the periphery region 14. The etching barrier layer 22 and the polysilicon layer 20 in the memory array area 12 are removed using an isotropic wet etching operation.

As shown in FIG. 3, the mask layer 24 above the etching barrier layer 22 is removed, and then the dielectric layer 18 in the memory array region 12 is stripped away to expose the substrate surface 16. As shown in FIG. 4, a dielectric layer 26 is formed over the exposed substrate 16, and serves as a gate oxide layer in the memory array area 12. Thereafter, a polysilicon layer 28, a tungsten silicide layer 30 and a silicon nitride layer 32 are formed, respectively, over the surface of the semiconductor wafer 10.

In the next step, as shown in FIG. 5, a photoresist layer 34 is deposited over the silicon nitride layer 32 and a lithographic process is performed to define gate patterns in the memory array area 12 and periphery circuit region 14. Next, using the photoresist layer 34 as a mask, the silicon nitride layer 32, the tungsten silicide layer 30 and the polysilicon layer 28 are etched, thereby exposing portions of the dielectric layer 26 in the memory array area 12 and portions of the etching barrier layer 22 in the periphery circuit region 14. As shown in FIG. 6, the photoresist layer 34 is removed. Thereafter, another photoresist layer 36 is deposited over the memory array area 12 for protecting the gate 33 structure, which includes the dielectric layer 26, the polysilicon layer 28, the tungsten silicide layer 30 and the silicon nitride layer 32.

As shown in FIG. 7, the photoresist layer 36 and the silicon nitride layer 32 of the periphery circuit region 14 are used as hard masks to remove the etching barrier layer 22 and the polysilicon layer 20 not covered by the silicon nitride layer 32 in the periphery circuit region 14. A gate 35 structure of the periphery circuit region 14 is formed, and the silicon nitride layer 32, the tungsten silicide layer 30, the polysilicon layer 28 and the photoresist layer 36 are then removed.

As shown in FIG. 8, an ion implantation process is performed to form lightly doped drain (LDD) 38 structures of the MOS transistors. Next, a silicon nitride layer 43 is deposited over the semiconductor wafer 10, followed by an anisotropic etching process to form spacers 44 on the walls of the gate 35 structures in the periphery circuit region 14. The remaining etching barrier layer 22 is removed after the formation of the spacers 44. A source 40 and a drain 42 of the MOS transistors are then formed in the periphery circuit region 14. Finally, as shown in FIG. 9, a self-aligned silicide operation is carried out to form a salicide layer 46 above each source 40, drain 42 and gate 35 structure in the periphery circuit region 14.

However, in FIG. 5 of the prior art method, the etching process is simultaneously performed in the memory array area 12 and in the periphery circuit region 14 to simultaneously form patterns of the gates. The density of the gates in the memory array area 12 is normally greater than that of the periphery circuit region 14, resulting in the etching process causing both a proximity effect and a loading effect. As well, in FIG. 7, an extra step is needed to remove the silicon nitride layer 32 in the periphery circuit region 14, when the silicon nitride layer 32 is not necessary for the gates 35 in the periphery circuit region 14.

SUMMARY OF THE INVENTION

It is a primary objective of the present invention to provide a method of manufacturing a MOS transistor of an embedded memory to solve the above-mentioned problems.

The method of the present invention involves first defining a memory array area and a periphery circuit region on the surface of the semiconductor wafer and to sequentially deposit a gate oxide layer, an undoped polysilicon layer and a dielectric layer. Next, the undoped polysilicon layer in the memory array area is implanted to form a doped polysilicon layer, followed by the removal of the dielectric layer in the memory array area. Thereafter, a metallic silicide layer and a passivation layer are formed, respectively, on the surface of the semiconductor wafer, and the passivation layer, the metallic silicide layer and the doped polysilicon layer are then etched to form a plurality of gates in the memory array area. Next, the passivation layer, the metallic silicide layer and the dielectric layer in the periphery circuit region are removed. Finally, the undoped polysilicon layer is etched to form a plurality of gates in the periphery circuit region, followed by the respective formation of spacers, sources and drains of each MOS transistor in the periphery circuit region.

There are two advantages of the present invention, the first of which is the simultaneous formation of the silicon nitride layer necessary for the gates in the memory array area and removal of the silicon nitride layer not necessary for the gates in the periphery circuit region. In the prior art method, after etching the gates in both the memory array area and in the periphery circuit region, an extra step is needed to remove the silicon nitride layer not necessary for the gates in the periphery circuit region to increase time cost. The second advantage is that the present invention performs the etching process to form separately the gates in the memory array area and those in the periphery circuit region to reduce both the proximity effect and the loading effect since the density of gate patterns of the DRAM is higher in the memory array than in the periphery circuit region.

DETAILED DESCRIPTION OF THE PREFERRED EMBODIMENT

Figure 1:
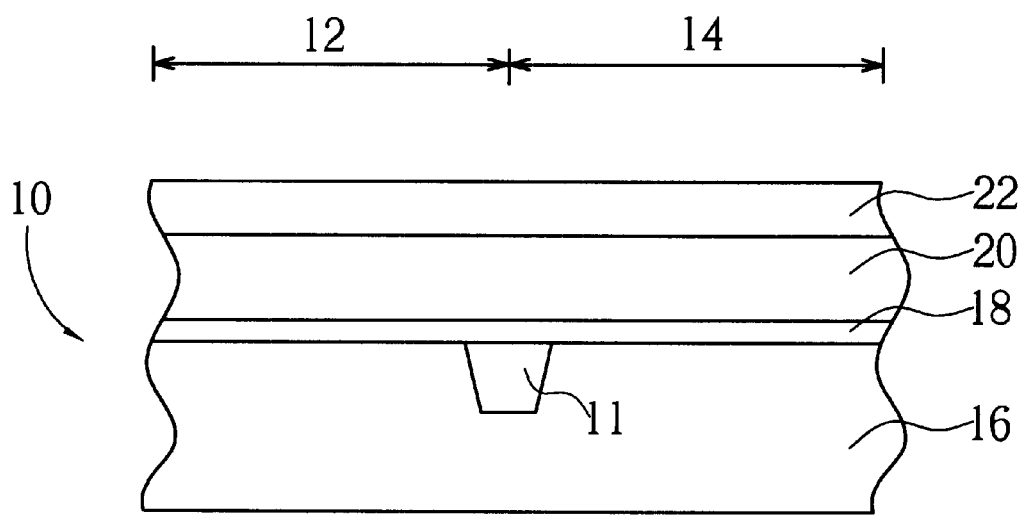
FIG. 1 to FIG. 9 are cross-sectional diagrams of the manufacturing process of a MOS transistor of an embedded memory according to the prior art.
Figure 2:
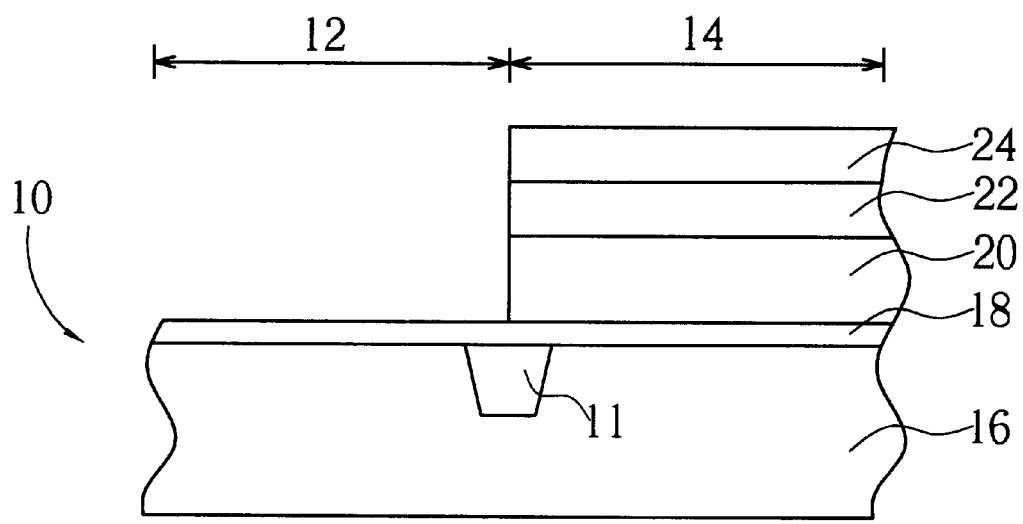
Figure 3:
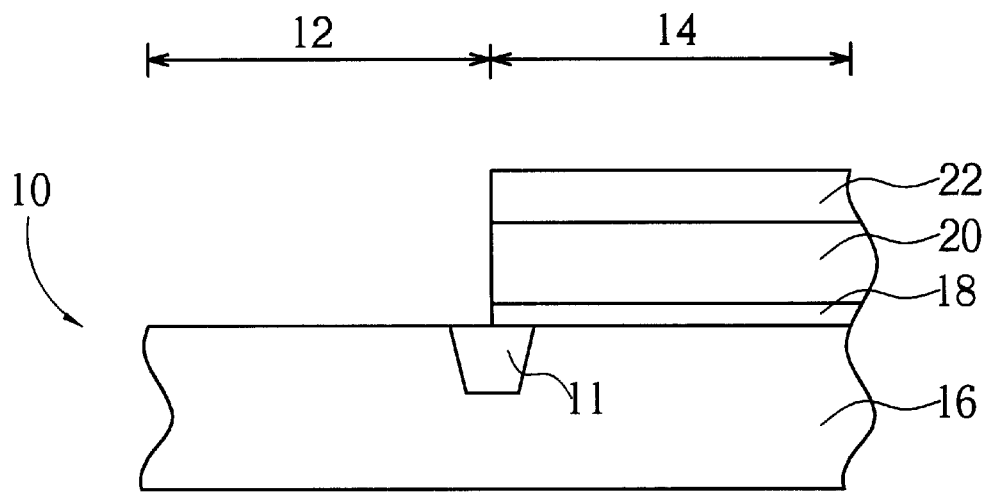
Figure 4:
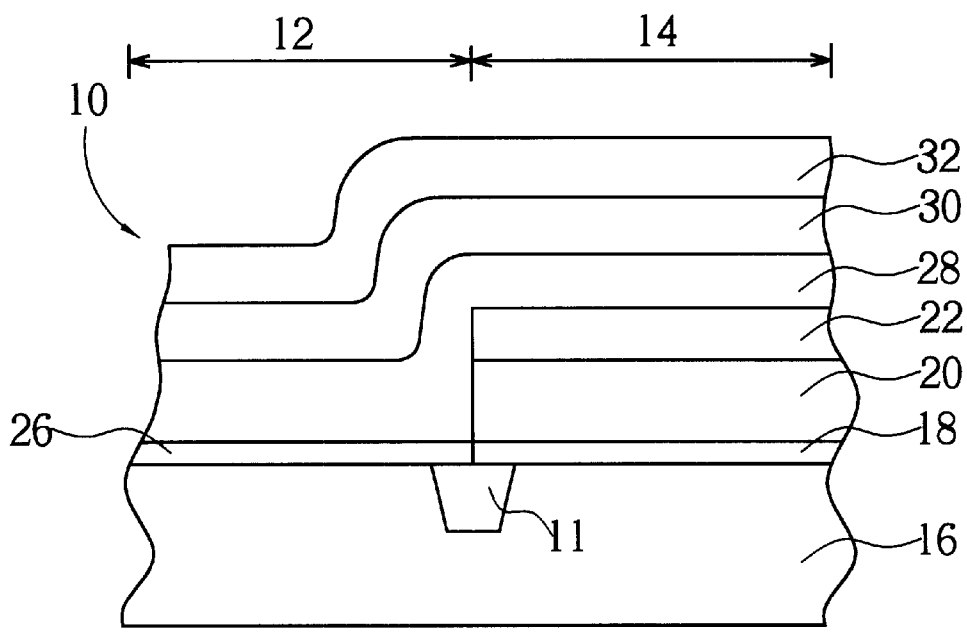
Figure 5:
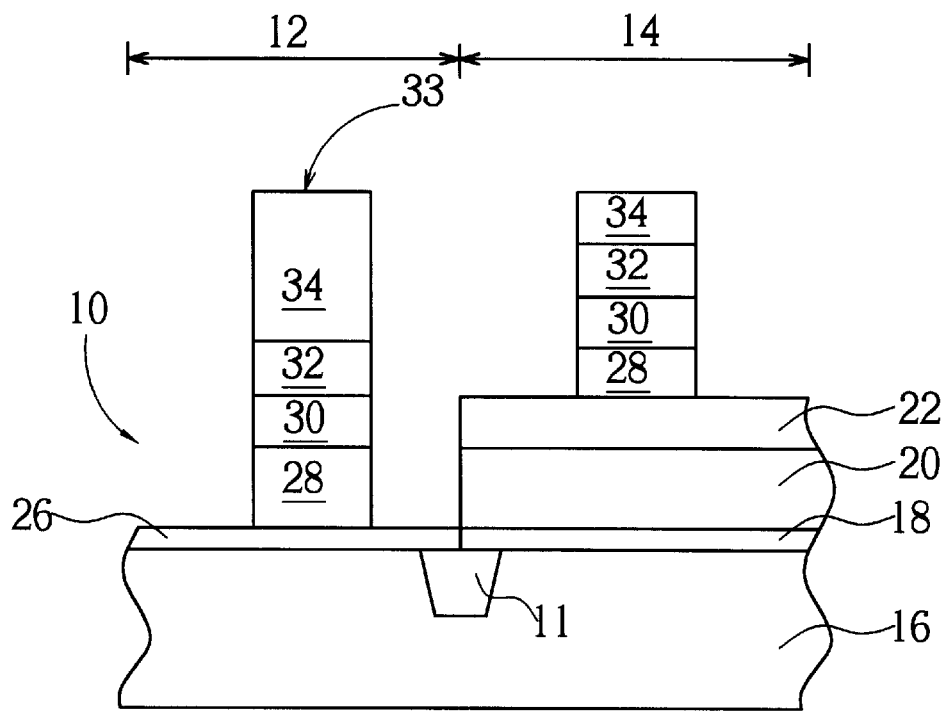
Figure 6:
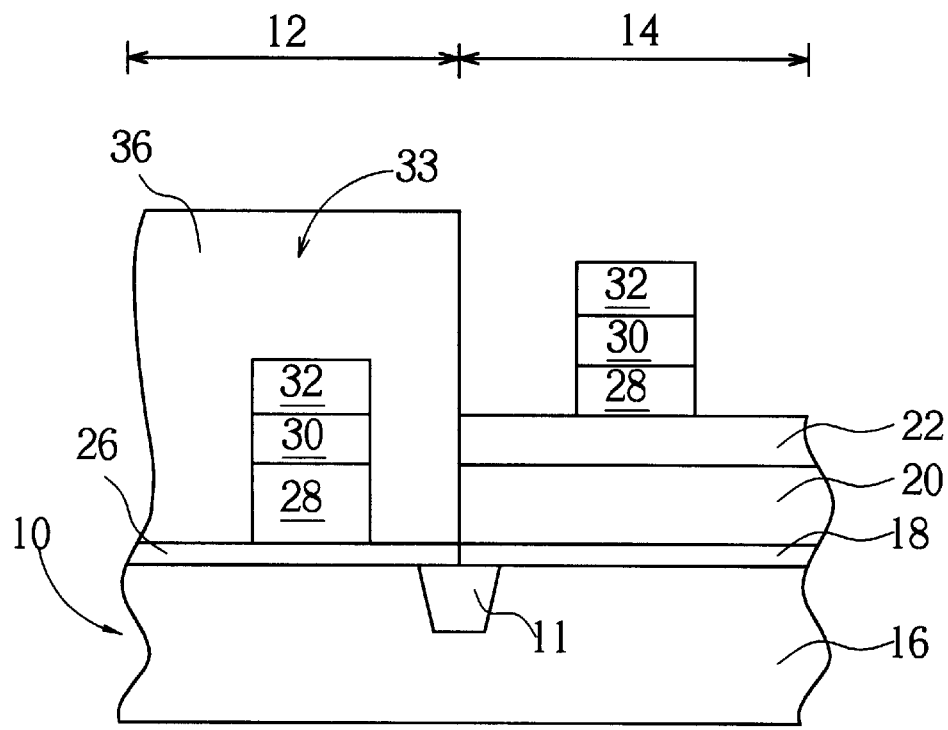
Figure 7:
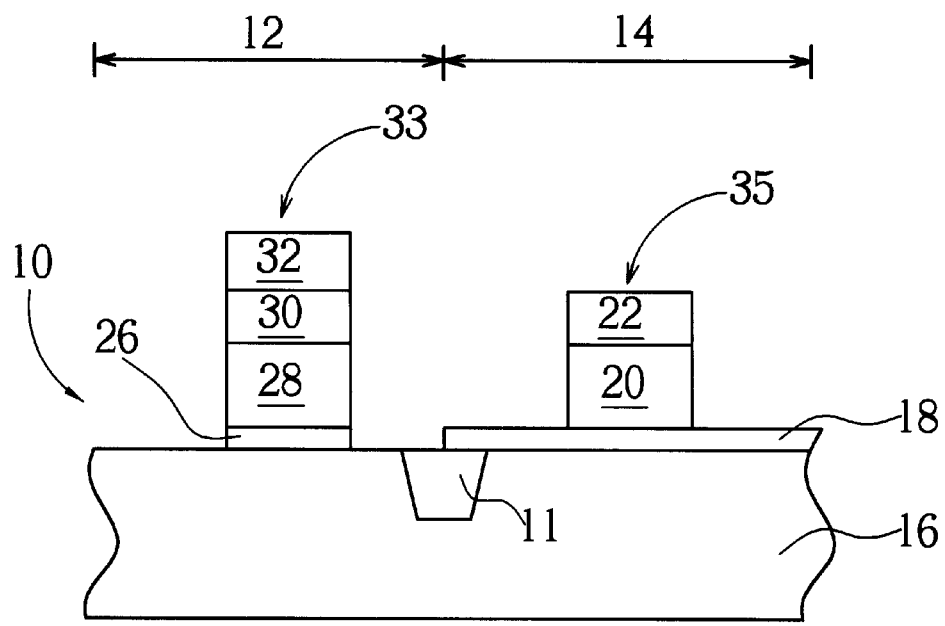
Figure 8:
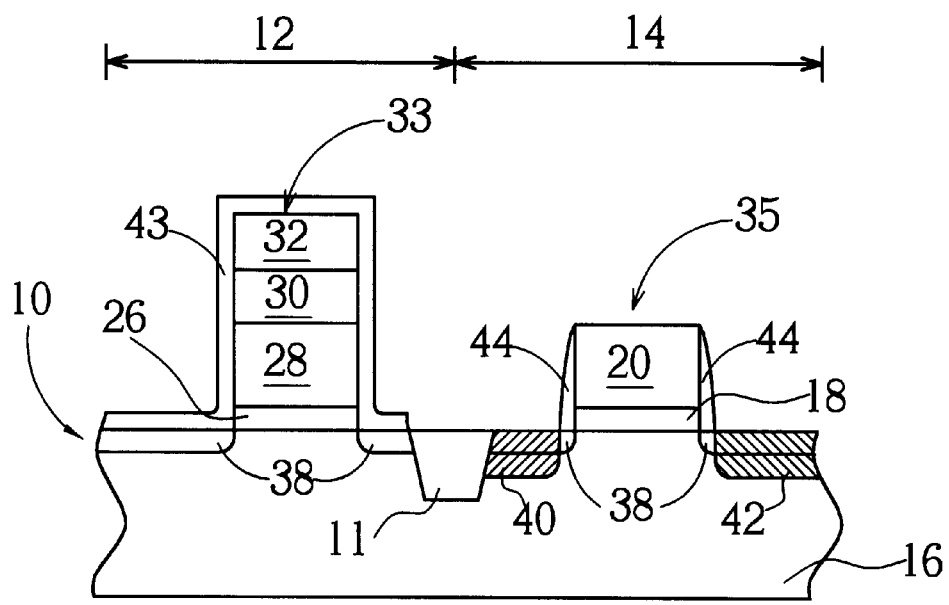
Figure 9:
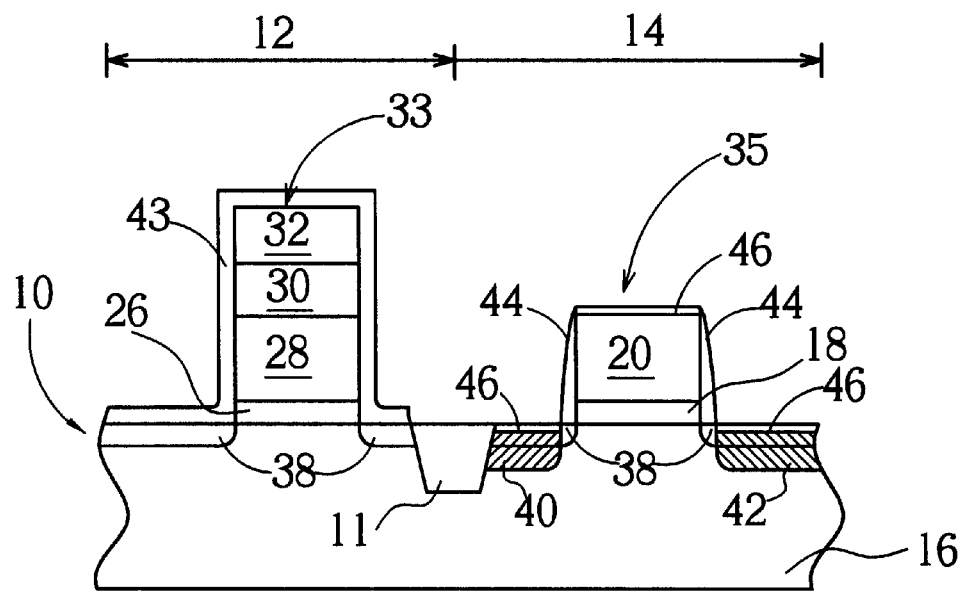
Figure 10:
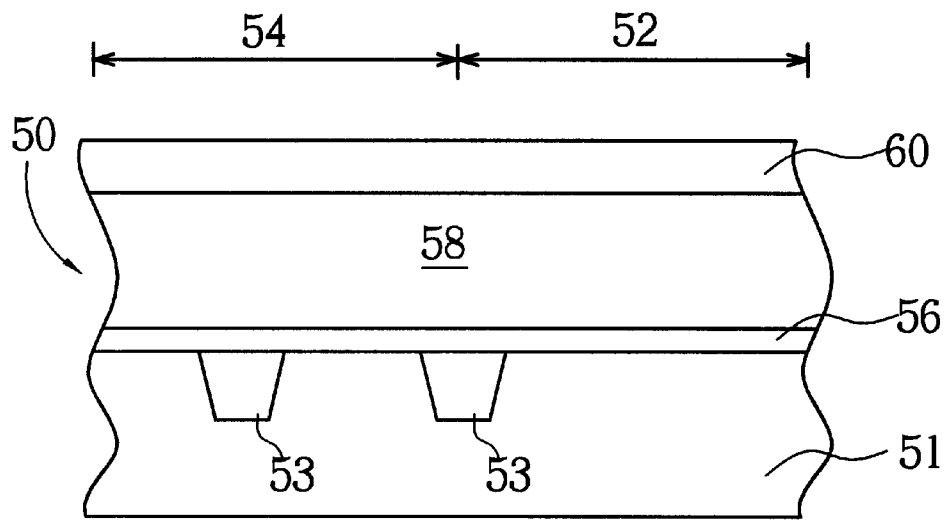
FIG. 10 to FIG. 18 are cross-sectional diagrams of the manufacturing process of a MOS transistor of an embedded memory according to the present invention.

Please refer to FIG. 10 to FIG. 10 FIG. 10 to FIG. 10 are cross-sectional diagrams of manufacturing a MOS transistor of an embedded memory according to the present invention. As shown in FIG. 10, the method of manufacturing a MOS transistor of an embedded memory according to the present involves first providing a semiconductor wafer 50 with a memory array area 52 and a periphery circuit region 54 defined on the surface of a silicon substrate 51 of the semiconductor wafer 50. A plurality of shallow trench isolation structures 53 are used to separate the memory array area 52 and the periphery circuit region 54.

Next, a first dielectric layer 56 is first formed on the surface of the silicon substrate 51 by a thermal oxidation method, followed by the deposition of an undoped polysilicon layer 58 by a low pressure chemical vapor deposition (LPCVD) method, and the formation of a second dielectric layer 60 on the surface of the undoped polysilicon layer 58 by a thermal oxidation method or a CVD method. The first dielectric layer 56 is composed of silicon dioxide ($SiO_2$) and serves both as the gate oxide layer for each MOS transistor and as the stop layer in the subsequent etching processes.

Figure 11:
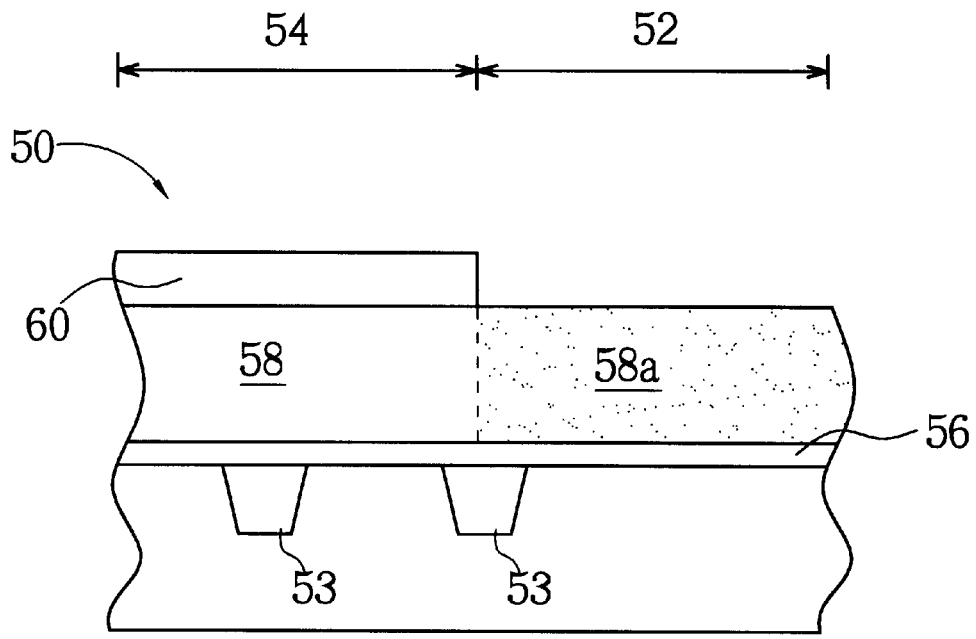

Please refer to FIG. 11, a photomask of the cell LDD of a pass transistor or a photomask of the cell well of the memory array area 52 is used to perform a lithography process for performing a first ion implantation process on the portion of the undoped polysilicon layer 58 in the memory array area 52, so as to form a doped polysilicon layer 58a. Thereafter, the portion of the second dielectric layer 60 in the memory array area 52 is removed so that the second dielectric layer 60 remains only in the periphery circuit region 54.

Figure 12:
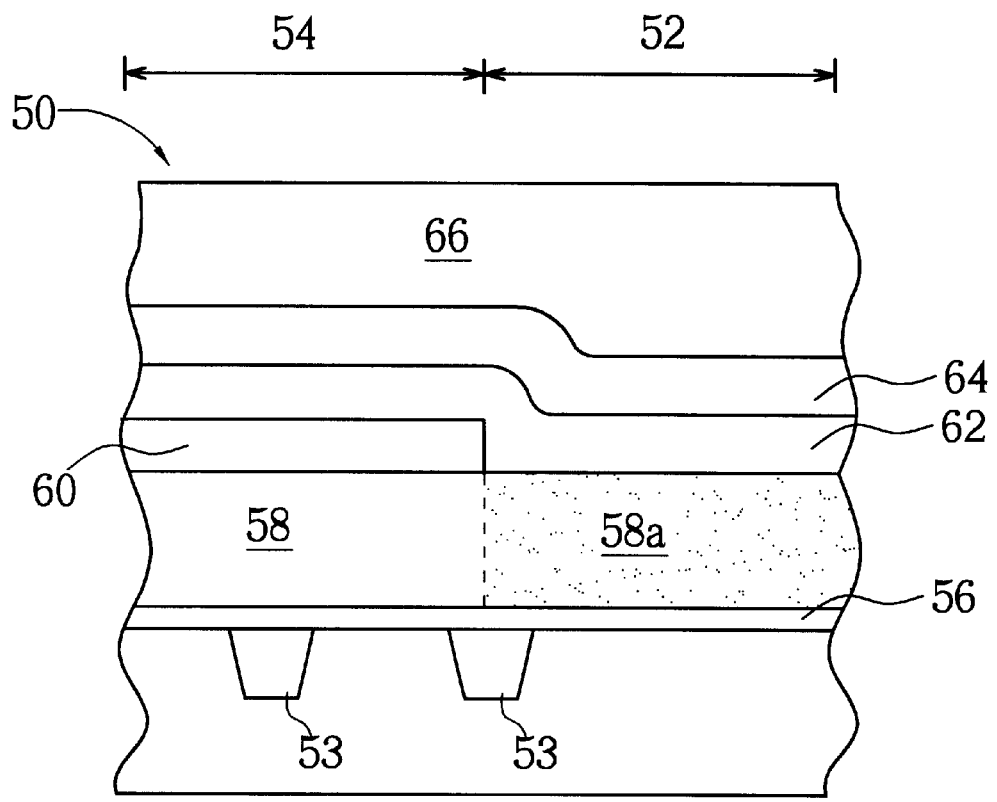

As shown in FIG. 12, a metallic silicide layer 62, a passivation layer 64, and a first photoresist layer 66 are formed, respectively, on the surface of the semiconductor wafer 50. The passivation layer 64 is composed of silicon nitride, and a silicon-oxy-nitride ($SiO_xN_y$) layer (not shown) serving as an anti-reflection coating (ARC) layer is positioned between the passivation layer 64 and the metallic silicide layer 62 to prevent reflected light from the surface of the metallic silicide layer 62 from influencing the exposure accuracy of the photoresist. The metallic silicide layer 62 and the doped polysilicon layer 58a together serve as the conductive layer of the gates of each MOS transistor.

Figure 13:
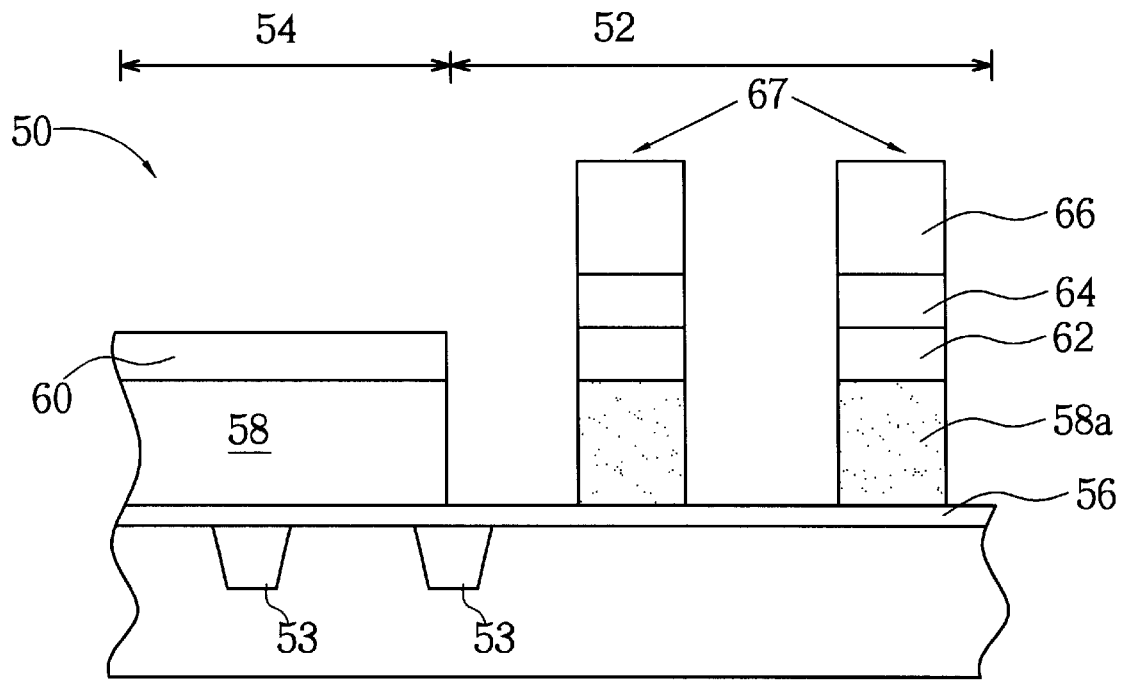

As shown in FIG. 13, a photolithographic process is again performed so as to define a plurality of gate 67 patterns (not shown) in the first photoresist layer 66 of the memory array area 52. Then, the gate patterns in the first photoresist layer 66 are used as a hard mask to etch the portions of the passivation layer 64, the metallic silicide layer 62, and the doped polysilicon layer 58a in the memory array area 52 down to the surface of the first dielectric layer 56. As well, an in-situ etching is performed on the portions of the passivation layer 64 and the metallic silicide layer 62 in the periphery circuit region 54 down to the surface of the second dielectric layer 60. The passivation layer 64 is composed of silicon nitride and serves as a cap layer of the gate 67 in the memory array area 52. The second dielectric layer 60 remaining in the periphery circuit region 54 functions as an etching barrier layer and serves as the stop layer in the etching process.

Figure 14:
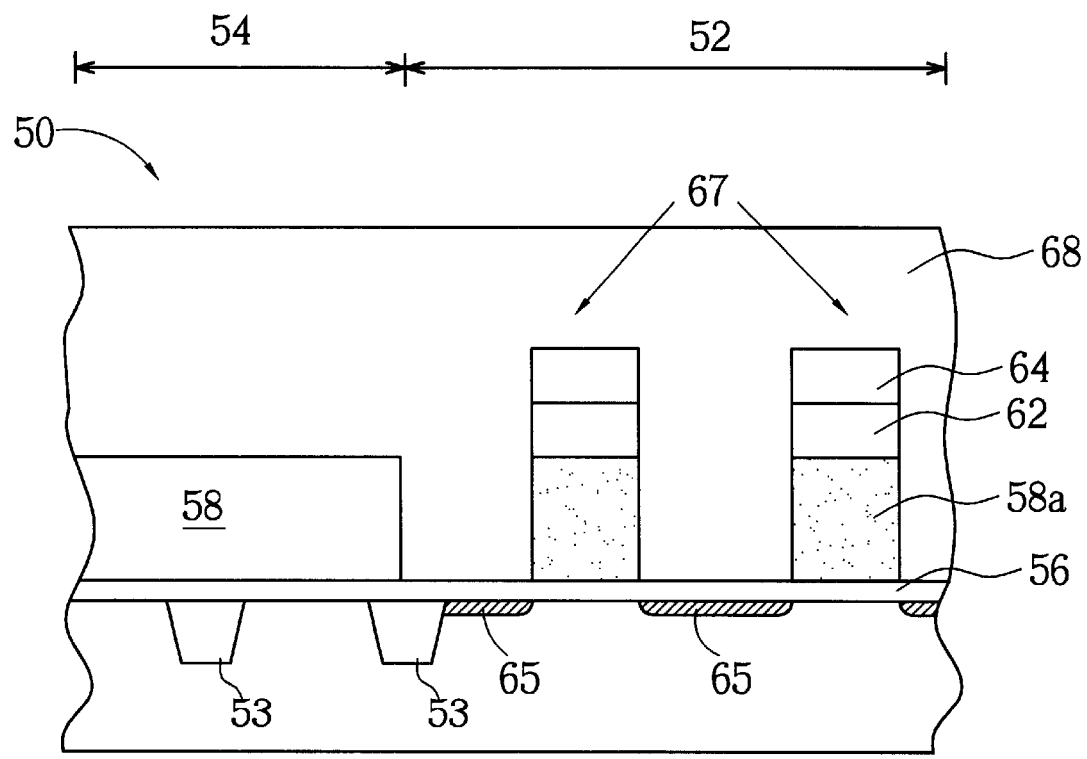

As shown in FIG. 14, an ion implantation process is performed to form lightly doped drains (LDD) 65 for each MOS transistor in the memory array area 52. Next, the first photoresist layer 66 and the second dielectric layer 60 in the periphery circuit region 54 are removed. A second photoresist layer 68 is formed on the surface of the semiconductor wafer 50. A silicon-oxy-nitride ($SiO_xN_y$) layer (not shown), serving as an anti-reflection coating (ARC) layer, is formed prior to the formation of the second photoresist layer 68 on the surface of the semiconductor wafer 50 to prevent reflected light from the surface of the metallic silicide layer 62 from influencing the exposure accuracy of the photoresist.

Figure 15:
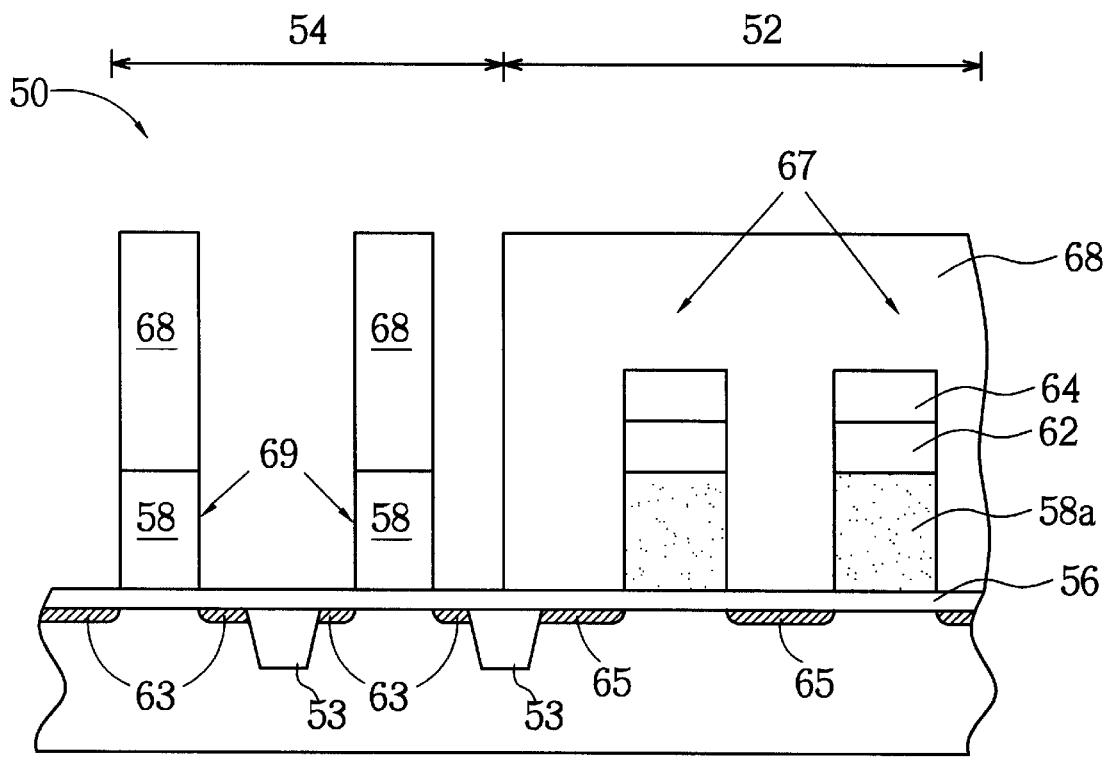

As shown in FIG. 15, a photolithographic process is performed to define a plurality of gate 69 patterns (not shown) in the second photoresist layer 68 in the periphery circuit region 54. Then, the gate patterns of the second photoresist layer 68 are used as a hard mask to etch the undoped polysilicon layer 58 in the periphery circuit region 54 down to the surface of the first dielectric layer 56 so as to form gates 69 for each MOS transistor in the periphery circuit region 54. An ion implantation is performed to form lightly doped drains (LDD) 63 for each of the MOS transistors in the periphery circuit region 54.

Figure 16:
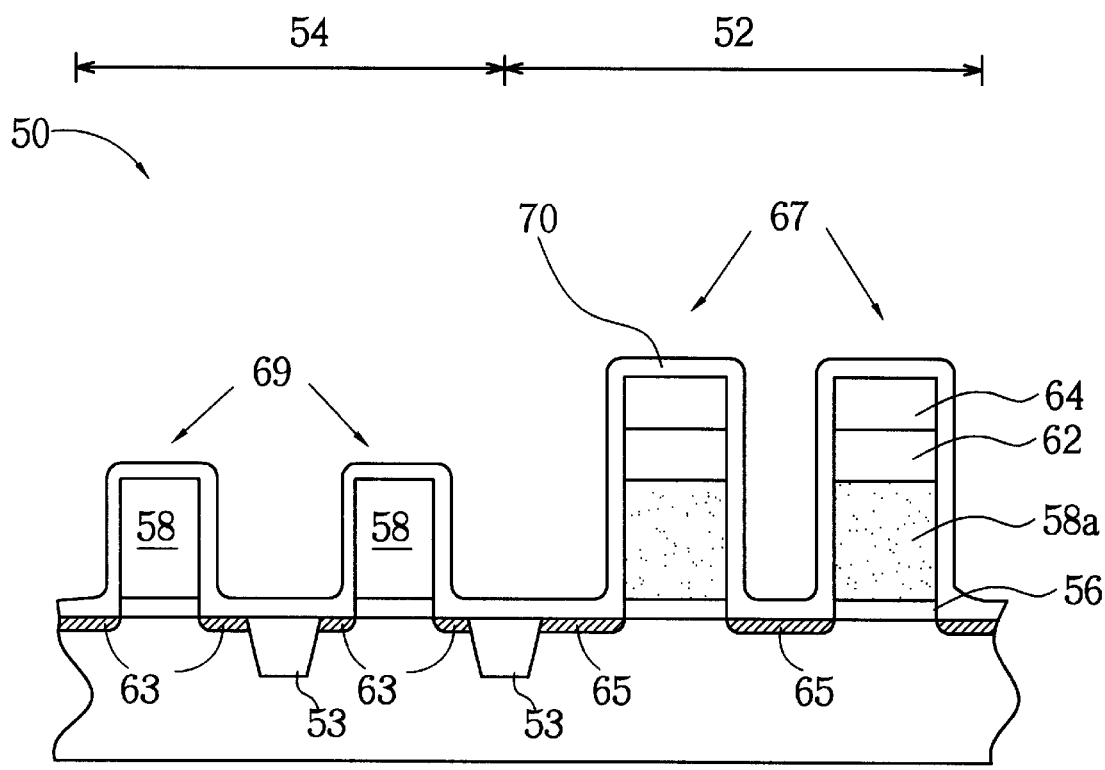
Figure 17:
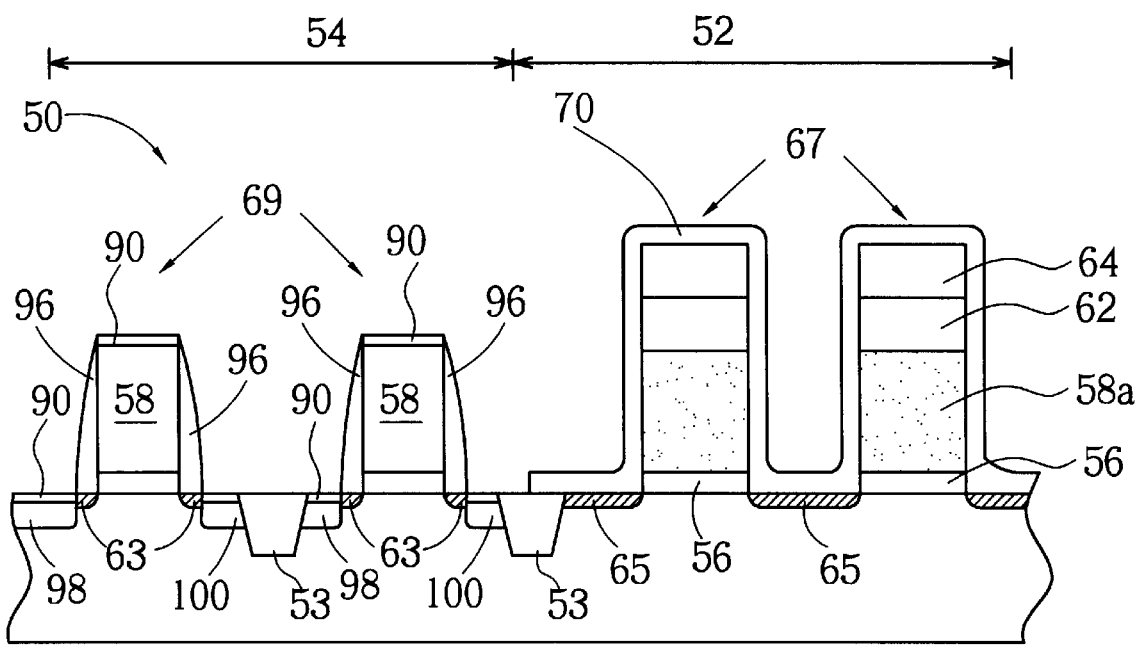

After removing the second photoresist layer 68 and the dielectric layer 56 not covered by each gate 67, 69, then as shown in FIG. 16, a silicon nitride layer 70 with a thickness of 350 angstroms (Å) is formed to cover the surface of each gate 67, 69. As shown in FIG. 17, the mask patterns defined by a photoresist layer (not shown) and a photolithography process are used to perform an etching process to remove portions of the silicon nitride layer 70 around each gate 69 in the periphery circuit region 54 so as to form spacers 96. Thereafter, an ion implantation process is performed to form a source 98 and a drain 100 for each MOS transistor in the periphery circuit region 54.

After the formation of the source 98 and the drain 100 of each MOS transistor in the periphery circuit region 64, a metal layer (not shown), made of Co, is formed on the surface of the semiconductor wafer 50. The metal layer covers the surfaces of the sources 98, the drains 100, and the gates 69 in the periphery circuit region 54. Then, a first rapid thermal process (RTP) is performed at a temperature between 400° C. and 600° C. for a duration of 10 to 50 seconds to form a salicide layer 90 on the surfaces of each source 98, drain 100 and gate 69 in the periphery circuit region 54. A wet etching process is then performed to remove the portions of the metal layer that do not react with the surface of the semiconductor wafer 50. Finally, a second rapid thermal process (RTP) is performed at a temperature between 600° C. and 800° C. for a duration of 10 to 50 seconds so that the $Co_2Si$ and $CoSi$ of the salicide layer 90 react to form $CoSi_2$, which has a lower resistance. However, Ti, Ni, or Mo can replace the Co that is used to form the metal layer.

The steps mentioned above only remove portions of the silicon nitride layer 70 in the periphery circuit region 54, and not the portions of the silicon nitride layer 70 in the memory array area 52 because the gates 67 in the memory array area 52 themselves have the isolation protective layers 64 needed in the subsequent self-aligned-contact (SAC) process. As well, the silicon nitride layer 70 is not needed to cover the surfaces of the gates 69 in the periphery circuit region 54 for conducting the subsequent salicide process.

Figure 18:
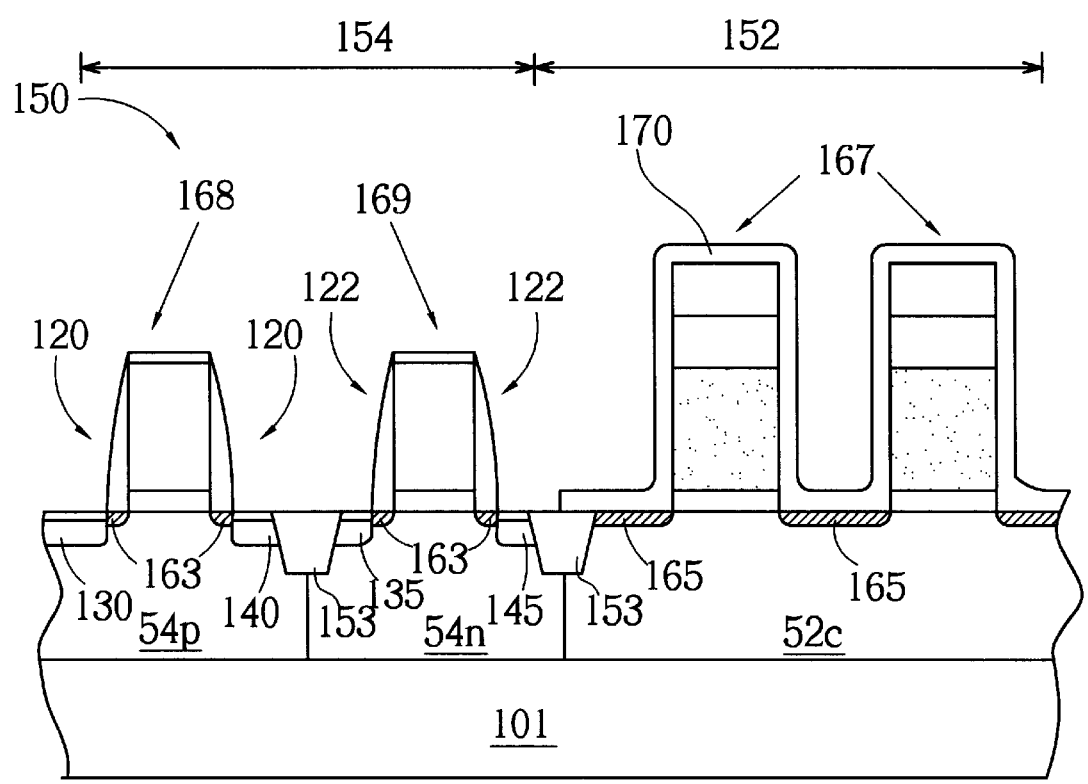

Please refer to FIG. 18 of a second preferred embodiment of the present invention. A semiconductor wafer 150 has both a memory array area 152 and a periphery circuit region 154 defined on the surface of a silicon substrate 101. The memory array area 152 comprises at least one cell-well 52c, and the periphery circuit region 154 comprises at least one N-well 54n and at least one P-well 54p. Several shallow trench isolation (STI) structures 153 are formed to separate each region.

As shown in FIG. 18, the primary difference between the manufacturing method of the second preferred embodiment and the manufacturing method illustrated in FIG. 10 to FIG. 17, is that the second preferred embodiment integrates the processes of CMOS transistors. Similar to the steps of the above-mentioned embodiment shown in FIG. 10 to FIG. 16, the gates 167, 168, 169 and the LDD 163, 165 are formed, respectively, on the semiconductor wafer 150. Then, a photolithographic process is used to first define the positions of the NMOS in the periphery circuit region 154, followed by the etching of the silicon nitride layer 170 around the gate 168 above the P-well 54p of the periphery circuit region 154 to form spacers 120. Next, an ion implantation process is performed to form a source 130 and a drain 140 of the NMOS transistor in the P-well 54p. Thereafter, a photolithographic process is again used to define the position of the PMOS in the periphery circuit region 154, followed by the etching of the silicon nitride layer 170 around the gate 169 above the N-well 54n of the periphery circuit region 154 to form spacers 122. Next, an ion implantation process is again performed to form a source 135 and a drain 145 of the PMOS transistor in the N-well 54n. Each ion implantation process implants the undoped polysilicon layer 158 of each gate 168, 169 above the P-well 54p and the N-well 54n, respectively.

The present invention method of manufacturing a MOS transistor of an embedded memory involves first forming each gate and LDD on the surface of the semiconductor wafer, followed by the formation of a silicon nitride layer on the surface of the semiconductor wafer covering each gate. Finally, the silicon nitride layer in the periphery circuit region is etched so as to form a spacer around each gate above the periphery circuit region.

In contrast to the prior art method for manufacturing a MOS transistor of an embedded memory, the present invention simultaneously forms gates with and without a cap layer followed by the salicide process of each MOS transistor in the periphery circuit region and the SAC process of pass transistors in the memory array area, respectively. As well, the present invention effectively reduces the proximity effect and the loading effect occurring in the prior art method when simultaneously forming gates in the memory array area and periphery circuit region.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a metal oxide semiconductor (MOS) transistor of an embedded memory, the method comprising:

providing a semiconductor wafer having a memory array area and a periphery circuit region defined on the surface of the semiconductor wafer;

forming a first dielectric layer, a polysilicon layer, and a second dielectric layer in order on the surface of the semiconductor wafer;

performing a first ion implantation process on the polysilicon layer above the memory array area so as to form a doped polysilicon layer above the memory array area;

removing the second dielectric layer above the memory array area;

forming a metallic silicide layer, a passivation layer, and a first photoresist layer in order on the surface of the semiconductor wafer;

performing a first photolithographic process so as to define a plurality of gate patterns in the first photoresist layer;

using the gate patterns in the first photoresist layer as a hard mask to etch the portions of the passivation layer, the metallic silicide layer, and the doped polysilicon layer that are above the memory array area down to the surface of the first dielectric layer, and an in-situ etching of the portions of the passivation layer and the metallic silicide layer that are above the periphery circuit region down to the surface of the second dielectric layer;

performing a second ion implantation process to form a lightly doped drain (LDD) for each MOS transistor in the memory array area;

removing the first photoresist layer and the second dielectric layer above the periphery circuit region;

forming a second photoresist layer on the surface of the semiconductor wafer;

performing a second photolithographic process to define a plurality of gate patterns in the second photoresist layer above the periphery circuit region;

using the gate patterns of the second photoresist layer as a hard mask to etch the polysilicon layer above the periphery circuit region down to the surface of the first dielectric layer so as to form gates for each MOS transistor in the periphery circuit region;

performing a third ion implantation to form a lightly doped drain (LDD) for each of the MOS transistors in the periphery circuit region;

removing the second photoresist layer;

forming a silicon nitride layer to cover the surface of each gate;

performing an etching process to remove portions of the silicon nitride layer in the periphery circuit region so as to form a spacer adjacent to each gate in the periphery circuit region; and performing a forth ion implantation process to form a source and a drain for each MOS transistor.

2. The method of claim 1 wherein the first dielectric layer is composed of silicon dioxide ($SiO_2$) and serves as the gate oxide layer for each MOS transistor.

3. The method of claim 1 wherein the first and the second ion implantation processes are performed by using a photomask of the LDD of each MOS transistor of the memory array area to define each area of implantation.

4. The method of claim 1 wherein the passivation layer is composed of silicon nitride, and a silicon-oxy-nitride ($SiO_xN_y$, where $0<x<2$ and $0<y<4/3$) layer serving as an anti-reflection coating (ARC) layer is disposed between the passivation layer and the metallic silicide layer.

5. The method of claim 1 wherein a silicon-oxy-nitride ($SiO_xN_y$, where $0<x<2$ and $0<y<4/3$) layer serving as an anti-reflection coating (ARC) layer is formed before the second photoresist layer is formed on the surface of the semiconductor wafer.

6. The method of claim 5 wherein after the second photoresist layer is removed, the silicon-oxy-nitride ($SiO_xN_y$, where $0<x<2$ and $0<y<4/3$) layer below the second photoresist layer is also removed.

7. The method of claim 1 wherein after the formation of the source and the drain of each MOS transistor, the method also comprises:
    forming a metal layer on the surface of the semiconductor wafer, the metal layer covering the surfaces of the sources, the drains, and the gates of the periphery circuit region;
    performing a first rapid thermal process (RTP);
    performing a wet etching process to remove the portions of the metal layer that do not react with the surface of the semiconductor wafer; and
    performing a second rapid thermal process (RTP).

8. The method of claim 7 wherein the metal layer is composed of cobalt (Co), titanium (Ti), nickel (Ni), or molybdenum (Mo).

9. The method of claim 7 wherein the first rapid thermal process is performed at a temperature that is between 400°°C. and 600° C. for a duration of 10 to 50 seconds, and the second rapid thermal process is performed at a temperature that is between 600°C and 800° C. for a duration of 10 to 50 seconds.

10. A method of fabricating a metal oxide semiconductor (MOS) transistor of an embedded memory, the method comprising:
    providing a semiconductor wafer having a memory array area and a periphery circuit region defined on the surface of the semiconductor wafer, the memory array area comprising at least one cell-well, the periphery circuit region comprising at least one N-well and at least one P-well;
    forming a first dielectric layer, a polysilicon layer, and a second dielectric layer in order on the surface of the semiconductor wafer;
    performing a first ion implantation process on the polysilicon layer above the memory array area so as to form a doped polysilicon layer above the memory array area;
    removing the portion of the second dielectric layer that is above the memory array area;
    forming a metallic silicide layer, a passivation layer, and a first photoresist layer in order on the surface of the semiconductor wafer;
    performing a first photolithographic process so as to define a plurality of gate patterns in the first photoresist layer;
    using the gate patterns in the first photoresist layer as a hard mask to etch the portions of the passivation layer, the metallic silicide layer, and the doped polysilicon layer that are above the memory array area down to the surface of the first dielectric layer, and an in-situ etching of the portions of the passivation layer and the metallic silicide layer that are above the second dielectric layer down to the surface of the second dielectric layer;
    removing the first photoresist layer;
    performing a second ion implantation process to form the lightly doped drains (LDD) of each MOS transistor in the memory array area;
    removing the second dielectric layer above the periphery circuit region;
    forming a second photoresist layer on the surface of the semiconductor wafer;
    performing a second photolithographic process to define a plurality of gate patterns in the second photoresist layer above the N-well and the P-well of the periphery circuit region;
    using the gate patterns of the second photoresist layer as a hard mask to etch the polysilicon layer above the periphery circuit region down to the surface of the first dielectric layer so as to form gates for each MOS transistor in the periphery circuit region;
    removing the second photoresist layer;
    performing a third ion implantation to form the lightly doped drains (LDD) for each of the MOS transistors in the periphery circuit region;
    removing the second photoresist layer;
    forming a silicon nitride layer to cover the surfaces of the gates;
    etching the portions of the silicon nitride layer adjacent to each gate above the P-well of the periphery circuit region to form a spacer, and performing a third ion implantation process to form a source and a drain for an NMOS transistor on the P-well; and
    etching the portions of the silicon nitride layer adjacent to each gate above the N-well of the periphery circuit region to form a spacer, and performing a forth ion implantation process to form a source and a drain for an NMOS transistor on the N-well.

11. The method of claim 10 wherein the first dielectric layer is composed of silicon dioxide ($SiO_2$) and serves as the gate oxide layer for each MOS transistor.

12. The method of claim 10 wherein the first and the second ion implantation processes are performed by using a photomask of the LDD of each MOS transistor of the memory array area to define each area of implantation.

13. The method of claim 10 wherein the passivation layer is composed of a silicon nitride, and a silicon-oxynitride ($SiO_xN_y$, where $0<x<2$ and $0<y<4/3$) layer serving as an anti-reflection coating (ARC) layer is disposed between the passivation layer and the metallic suicide layer.

14. The method of claim 10 wherein a silicon-oxy-nitride ($SiO_xN_y$, where $0<x<2$ and $0<y<4/3$) layer serving as an anti-reflection coating (ARC) layer is formed before the second photoresist layer is formed on the surface of the semiconductor wafer.

15. The method of claim 14 wherein after the second photoresist layer is removed, the silicon-oxy-nitride ($SiO_xN_y$, where $0<x<2$ and $0<y<4/3$) layer below the second photoresist layer is also removed.

16. The method of claim 10 wherein after the formation of the source and the drain of each MOS transistor, the method also comprises:
    forming a metal layer on the surface of the semiconductor wafer, the metal layer covering the surfaces of the sources, the drains, and the gates of the periphery circuit region;
    performing a first rapid thermal process (RTP);
    performing a wet etching process to remove the portions of the metal layer that do not react with the surface of the semiconductor wafer; and
    performing a second rapid thermal process (RTP).

17. The method of claim 16 wherein the metal layer is composed of cobalt (Co), titanium(Ti), nickel (Ni) or molybdenum (Mo).

18. The method of claim 16 wherein the first rapid thermal process is performed with a temperature that is between 400° C. and 600° C. for a duration of 10 to 50 seconds, and the second rapid thermal process is performed with a temperature that is between 600° C. and 800° C. for a duration of 10 to 50 seconds.

* * * * *